United States Patent [19]
Choi et al.

[11] Patent Number: 6,094,382
[45] Date of Patent: Jul. 25, 2000

[54] INTEGRATED CIRCUIT MEMORY DEVICES WITH IMPROVED LAYOUT OF FUSE BOXES AND BUSES

[75] Inventors: Jong-Hyun Choi, Kyonggi-do; Jun-Young Jeon, Seoul, both of Rep. of Korea

[73] Assignee: Samsung Electronics Co., Ltd., Rep. of Korea

[21] Appl. No.: 09/200,008

[22] Filed: Nov. 25, 1998

[30] Foreign Application Priority Data

Nov. 27, 1997 [KR] Rep. of Korea ............ 97- 63404

[51] Int. Cl.[7] .................................................. G11C 7/00
[52] U.S. Cl. ........................... 365/200; 365/51; 365/63; 365/225.7; 365/230.03
[58] Field of Search .............. 365/200, 230.03, 365/225.7, 63, 51

[56] References Cited

U.S. PATENT DOCUMENTS

| | | | |
|---|---|---|---|
| 5,469,388 | 11/1995 | Park .......................... | 365/230.06 X |
| 5,612,923 | 3/1997 | Gibson et al. ............. | 365/230.06 X |
| 5,732,029 | 3/1998 | Lee et al. .................. | 365/200 |
| 5,848,007 | 12/1998 | Takahashi .................. | 365/200 |

*Primary Examiner*—Do Hyun Yoo
*Attorney, Agent, or Firm*—Myers Bigel Sibley & Sajovec

[57] ABSTRACT

A row redundancy fuse box that replaces a defective row with a redundant row of an integrated circuit memory device is located between a row decoder, a row predecoder and a subarray block control circuit. By locating the row redundancy fuse box between the row decoder and the subarray block control circuit, the size of an integrated circuit memory device and the bus line loading in the device may be reduced. A row predecoder is coupled to the row redundancy fuse box and is located remote from the row decoder, the subarray block control circuit and the row redundancy fuse box. A column decoder is located adjacent the row predecoder and remote from the row decoder, the subarray block control circuit and the row redundancy fuse box. A pad layer receives and transmits external input and output signals respectively, and is located adjacent the subarray block control circuit, opposite the row redundancy fuse box. The predecoded row address bus and the row decoder overlap one another in the integrated circuit memory device. More specifically, the row decoder is preferably beneath the predecoded row address bus in the integrated circuit memory device. This can also decrease the size of the integrated circuit memory device. According to another aspect, the redundancy enable bus extends from the fuse box, up to but not beyond the predecoded row address bus.

21 Claims, 6 Drawing Sheets

INTEGRATED CIRCUIT MEMORY DEVICES WITH IMPROVED LAYOUT OF FUSE BOXES AND BUSES

FIELD OF THE INVENTION

The present invention relates to integrated circuit memory devices such as Dynamic Random Access Memory (DRAM) devices, and more particularly to the layout of integrated circuit memory devices in an integrated circuit.

BACKGROUND OF THE INVENTION

Integrated circuit memory devices such as DRAM devices are widely used in consumer and industrial products. As is well known to those having skill in the art integrated circuit memory devices include an array of memory cells that are generally arranged in rows and columns. It will be understood that as used herein, rows and columns are used to identify relative directions in an array of memory cells rather than an absolute horizontal or vertical direction. Data is written into and read from selected memory cells using peripheral circuits including decoders and control circuits. The array of memory cells may also be arranged in a plurality of subarray blocks, each having rows and columns.

As the integration density and speed of integrated circuit memory devices continue to increase, efforts have been made to decrease the size of the individual memory cells. Moreover, efforts have also been made to more efficiently lay out or arrange the peripheral circuits in the integrated circuit, so that more of the integrated circuit area may be occupied by memory cells rather than peripheral circuits.

FIG. 1 illustrates a conventional layout of an integrated circuit memory device 400 such as a 16 Megabit DRAM, in an integrated circuit such as a semiconductor substrate 410. The integrated circuit is also referred to as a chip. Referring to FIG. 1, a plurality of subarray blocks 7a, 7b, . . . , 7t of memory cells are grouped into four groups of subarray blocks in a cell area of the integrated circuit 410. The portion of the integrated circuit outside the memory cells is also referred to as a peripheral circuit area.

The peripheral circuit area includes pad layers 1a and 1b arranged transversely at the center of the integrated circuit, subarray block control circuits 6a and 6c, 6b and 6d arranged symmetrically on opposite sides of the pad layers 1a and 1b respectively, and row decoders 5a and 5c, 5b and 5d arranged symmetrically on opposite sides and remote from the pad layers 1a and 1b respectively. The peripheral circuit area also includes column decoders 9a and 9c, 9b and 9d longitudinally arranged symmetrically adjacent inner edges of the pad layers 1a and 1b respectively, buffer and control circuits 2a and 2b, 2c and 2d arranged between the column decoders 9a and 9b, 9c and 9d respectively, a column redundancy circuit 4a and a row redundancy circuit 3a arranged between the buffer and control circuits 2a and 2b, and a column redundancy circuit 4b and a row redundancy circuit 3b arranged between the buffer and control circuits 2c and 2d.

An area designated by a reference numeral 80, includes a bit line sense amplifier for sensing and amplifying a potential difference between a bit line connected to a selected memory cell and a reference bit line. The area 80 also includes an array select switching circuit for deactivating one block when one of the adjacent subarray blocks is activated so that the sense amplifier may be shared by the adjacent subarray blocks, and an input/output gate circuit for gating input/output of data.

The pad layers 1a and 1b include a plurality of pads that can be wire-bonded to a lead frame. Each pad supplies an external power source, or can receive and/or transmit various external input and output signals, respectively. The external input and output signals can include control signals for a read/write operation, read data or write data. The various control signals can include address signals, a row address strobe signal and a column address strobe signal. These various control signals are applied to the buffer and control circuits 2a, 2b, 2c and 2d through the pad layers 1a and 1b. The buffer and control circuits 2a, 2b, 2c and 2d include an input/output buffer, a control buffer and an address buffer. The buffer and control circuits 2a, 2b, 2c and 2d multiplex applied address signals to latch the multiplexed signals to the address buffer as row and column addresses, and supply read data stored in the input/output buffer to external of the memory device.

For column and row redundancy operations, the column redundancy circuits 4a and 4b and the row redundancy circuits 3a and 3b include column and row fuse boxes each having a plurality of fuses such as polysilicon fuses that can be cut or trimmed, for example by laser or current. The row redundancy operation deactivates a normal word line selected by decoding row address signals and activates a corresponding spare word line. The normal word line is replaced with the spare word line in order to repair a defective memory cell connected to the normal word line by use of a redundancy memory cell. The column redundancy operation deactivates a normal bit line selected by decoding column address signals and activates a corresponding spare bit line. The row redundancy circuits 3a and 3b each generally includes a row fuse box, and the column redundancy circuits 4a and 4b each generally includes a column fuse box. The total size of the column fuse box may be about one quarter of that of the row fuse box.

The row decoders 5a, 5c, 5b and 5d are arranged adjacent the cell region and generate a select signal to designate one of a plurality of word lines by decoding the applied row addresses. The applied row addresses may be generated from a row address buffer located within the buffer and control circuits 2a, 2b, 2c and 2d and from a row predecoder for predecoding a part of the row addresses. The word lines are connected to a plurality of memory cells belonging to the same row.

The subarray block control circuits 6a, 6c, 6b and 6d control the subarray blocks 7a, 7b, . . . , 7t to read data from the memory cells and to write data into the memory cells. In more detail, the subarray block control circuits 6a, 6c, 6b and 6d receive row and column addresses, control the operation of the sense amplifier connected to a bit line and a data bus line in a read operating mode, and control a write driver in a write operating mode. The subarray blocks 7a, 7b, . . . 7t include a plurality of memory cells, each of which may include one access transistor and one storage capacitor. The memory cells are arranged in an array or matrix of rows and columns. The gate of a transistor may be connected to a word line and the drain thereof may be connected to a bit line. Other memory cell configurations may also be used.

FIG. 2 illustrates a more detailed layout of row redundancy circuits shown in FIG. 1. FIG. 2 shows about half the layout of the integrated circuit memory device 400 of FIG. 1. When turning the drawing of FIG. 1 counterclockwise by 90°, the layout of the fuse boxes within the row redundancy circuits may be seen. Referring to FIG. 2, one pad layer 1a of the pad layers 1a and 1b shown in FIG. 1 is illustrated at the center of the drawing. The subarray block control circuit 6a indicated in FIG. 1 is divided into two circuits 6ai and 6aj to the left of the pad layer 1a. Similarly, the subarray block control circuit 6c depicted in FIG. 1 is arranged as two circuits 6ci and 6cj to the right of the pad layer 1a. When including three subarray blocks 7e, 7d and 7c as indicated in FIG. 1, the row decoder 5a is divided into three row decoders 5ai, 5aj and 5ak, and the row decoder 5c is divided into three row decoders 5ci, 5cj and 5ck. Since the layout of FIG. 2 is a symmetric structure centering on the pad layer 1a, the layout of the left of the pad layer 1a generally will be described hereinafter.

The column decoder 9a, and the subarray blocks 7e, 7d and 7c are identical to those shown in FIG. 1. The respective subarray blocks 7e, 7d and 7c include a redundancy cell block 7sp having a plurality of redundancy memory cells. An array select switching circuit 80a, a sense amplifier 80b, an input/output gate circuit 80c and an array select switching circuit 80d are arranged within the area 80 shown in FIG. 1 between the subarray blocks 7e and 7d. An array select switching circuit 80e, a sense amplifier 80f, an input/output gate circuit 80g and an array select switching circuit 80h are arranged within the area 80 between the subarray blocks 7d and 7c. A fuse box 3ai situated within the row redundancy circuit 3a shown in FIG. 1 includes a plurality of fuses such as polysilicon fuses therein and may be about four times as large as the column fuse box.

Redundancy enable signals REDi-REDn that are generated through output buses of the fuse box 3ai, are respectively supplied to the row decoders 5ai, 5aj and 5ak. Address signals AO–A11 that are generated through the pad layer 1a are applied to a row predecoder 21a. Predecoding row addresses DRAi-DRAn that are generated through output buses of the row predecoder 21a, are supplied to the row decoders 5al, 5aj and 5ak and to the fuse box 3ai.

The buses for transferring the redundancy enable signals REDi-REDn and the buses for transferring the predecoding row addresses DRAi-DRAn intersect at an area A. These buses are arranged on different layers of the integrated circuit in order to electrically isolate each other at the upper portion of a word line layer. Therefore, the size of the area A may impact the overall size of the integrated circuit. Moreover, since the buses for transferring the redundancy enable signals REDi-REDn are positioned at an area B, the integrated circuit memory may increase in size due to the number of the bus lines and the width thereof. Furthermore, since part of the buses for transferring the redundancy enable signals REDi-REDn may be connected to the row decoder 5ak which is remote, bus line loading may increase during operation of the device. Although the predecoding row addresses DRAi-DRAn generated from the row predecoder 21a are directly applied to the row decoders, they may be applied to the fuse box 3ai through other buses. Hence, the area occupied by the buses may increase.

Accordingly, a conventional layout as described above may increase the size of the integrated circuit and the bus line loading. Hence, an improved layout which can reduce the size of the integrated circuit and reduce the bus line loading would be desirable.

SUMMARY OF THE INVENTION

It is therefore an object of the present invention to provide improved layouts of integrated circuit memory devices.

It is another object of the present invention to provide layouts of integrated circuit devices that can reduce the size of the integrated circuits.

It is another object of the present invention to provide layouts of integrated circuits which can reduce bus line loading.

These and other objects are provided, according to the present invention, by integrated circuit memory devices in which a row redundancy fuse box that replaces a defective row with a redundant row, is located between a row decoder, a row predecoder and a subarray block control circuit. As is well known to those having skill in the art, an integrated circuit memory device also includes an array of memory cells that are arranged in a plurality of subarray blocks having rows and columns, a row decoder that designates at least one row of the subarray blocks, and a subarray block control circuit that controls the plurality of subarray blocks to write data into the memory cells and to read data from the memory cells. By locating the row redundancy fuse box between the row decoder and the subarray block control circuit, the size of an integrated circuit memory device and the bus line loading in the device, may be reduced.

According to other aspects of the invention, a row predecoder is coupled to the row redundancy fuse box and is located remote from the row decoder, the subarray block control circuit and the row redundancy fuse box. A column decoder is located adjacent the row predecoder and remote from the row decoder, the subarray block control circuit and the row redundancy fuse box. A pad layer receives and transmits external input and output signals respectively, and is located adjacent the subarray block control circuit, opposite the row redundancy fuse box.

According to another aspect of the present invention, the predecoded row address bus and the row decoder overlap one another in the integrated circuit memory device. More specifically, the row decoder is preferably beneath the predecoded row address bus in the integrated circuit memory device. This can also decrease the size of the integrated circuit memory device. According to another aspect, the redundancy enable bus extends from the fuse box, up to but not beyond the predecoded row address bus.

It will be understood by those having skill in the art that each of the row redundancy fuse boxes that are located between the row decoder and the subarray block control circuit, the row predecoder that is located remote from the row decoder, the column decoder that is located adjacent the row predecoder, the pad layer that is located adjacent the subarray block control unit and the overlapping predecoded row address bus and the row decoder, may be used individually to provide improved layouts of integrated circuit memory devices. Moreover, they may also be used in combinations and subcombinations to provide greater improvement in the layout of integrated circuit memory devices.

DETAILED DESCRIPTION OF PREFERRED EMBODIMENTS

Figure 1:
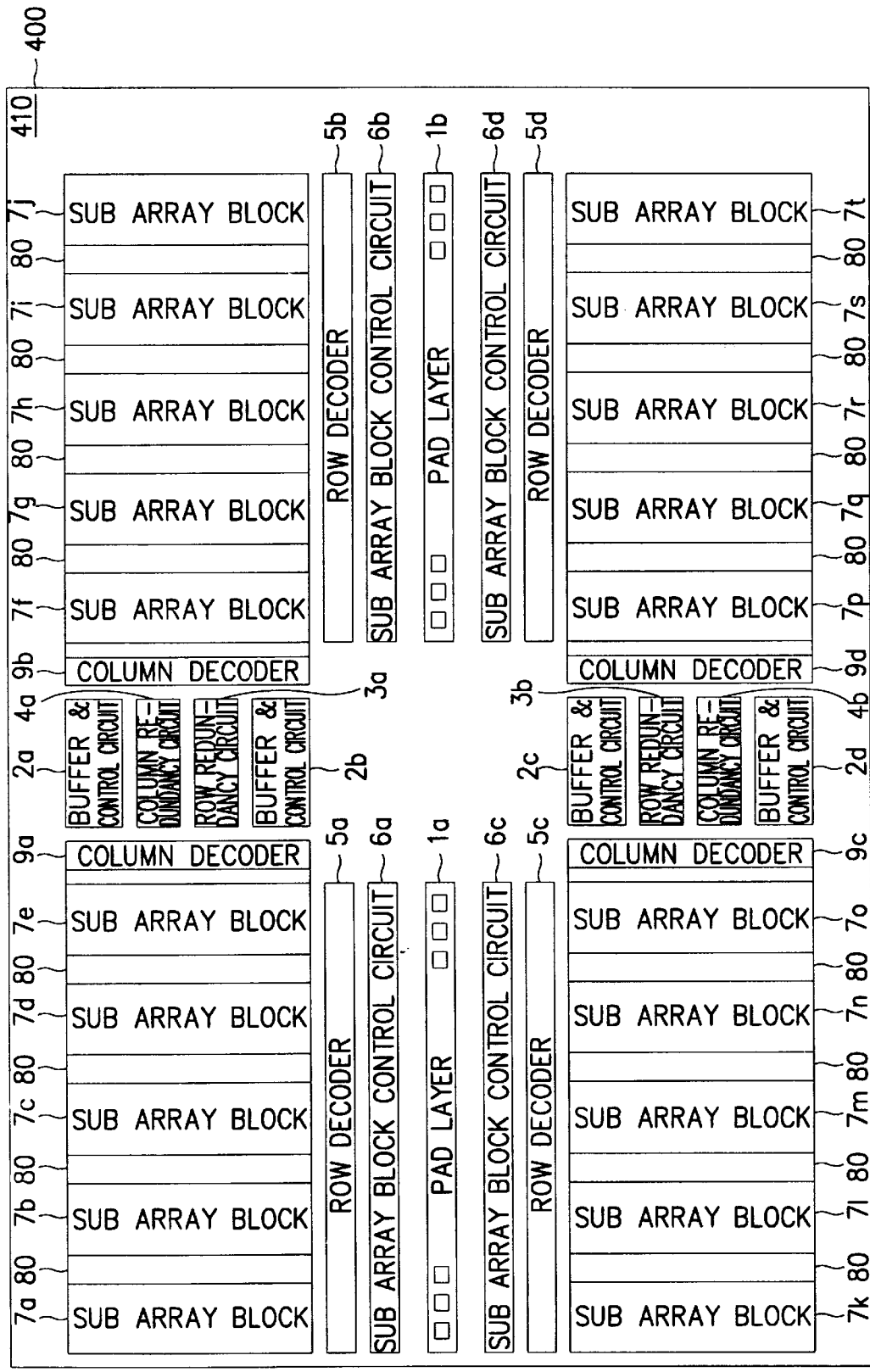
FIG. 1 is a plane layout of a conventional integrated circuit memory device.

The present invention now will be described more fully hereinafter with reference to the accompanying drawings, in which preferred embodiments of the invention are shown.

This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. In the following description, numerous specific details for the layout are set forth to provide a more thorough understanding of the present invention. It will be apparent, however, to one skilled in the art that the present invention may be practiced without these specific details. In other instances, features or functions of conventional semiconductor circuit element blocks have not been described so as not to obscure the present invention.

Figure 3:
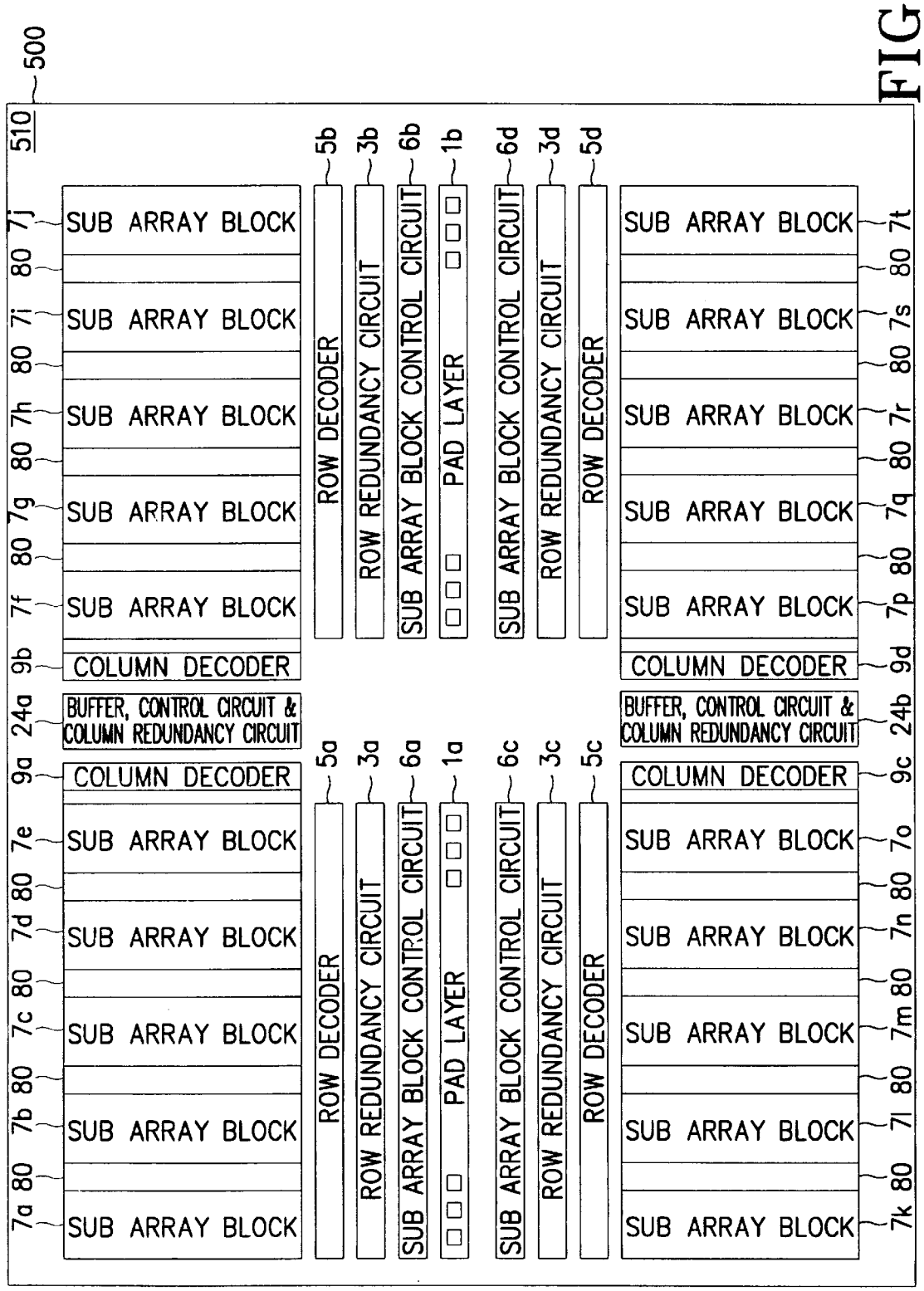
FIG. 3 is a plane layout of integrated circuit memory devices according to the present invention.

FIG. 3 illustrates a layout of integrated circuit memory devices 500 such as a 16 megabit DRAM in an integrated circuit such as a semiconductor substrate 510. Referring to FIG. 3, the subarray blocks 7a, 7b, . . . , 7t are grouped into four groups of subarray blocks in the cell area of the integrated circuit, as in FIG. 1. The layout of the pad layers 1a and 1b, the subarray block control circuits 6a, 6c, 6b and 6d. the row decoders 5a, 5c, 5b and 5d, and the column decoders 9a, 9c, 9b and 9d within the peripheral circuit area are the same as that shown in FIG. 1. However, the row redundancy circuit 3a is arranged between the row decoder 5a and the subarray block control circuit 6a, and the row redundancy circuit 3b is arranged between the row decoder 5b and the subarray block control circuit 6b. Similarly, the row redundancy circuits 3c and 3d are respectively arranged between a corresponding row decoder and a corresponding subarray block control circuit. By such a rearrangement of the row redundancy circuits, the size of an integrated circuit memory device and the bus line loading may be reduced. For ease of illustration, the buffer and control circuits 2a and 2b and the column redundancy circuit 4a shown in FIG. I appear as a buffer, control circuit and column redundancy circuit 24a. The layout of the area 80 is the same as that shown in FIG. 1. The function and operation of each block of FIG. 3 are the same as those of FIG. I.

Figure 2:
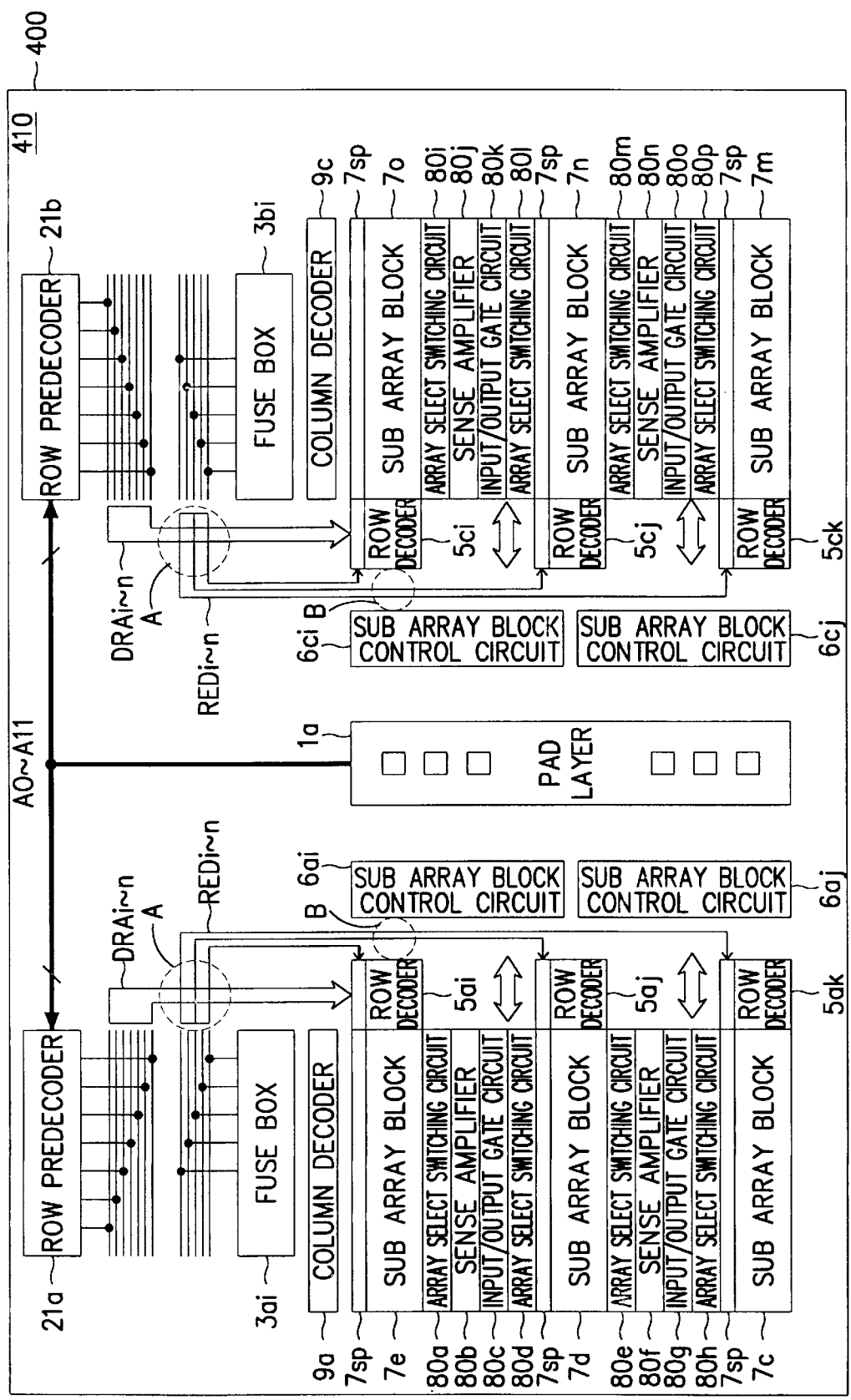
FIG. 2 is a more detailed layout of row redundancy circuits shown in FIG. 1.
Figure 4:
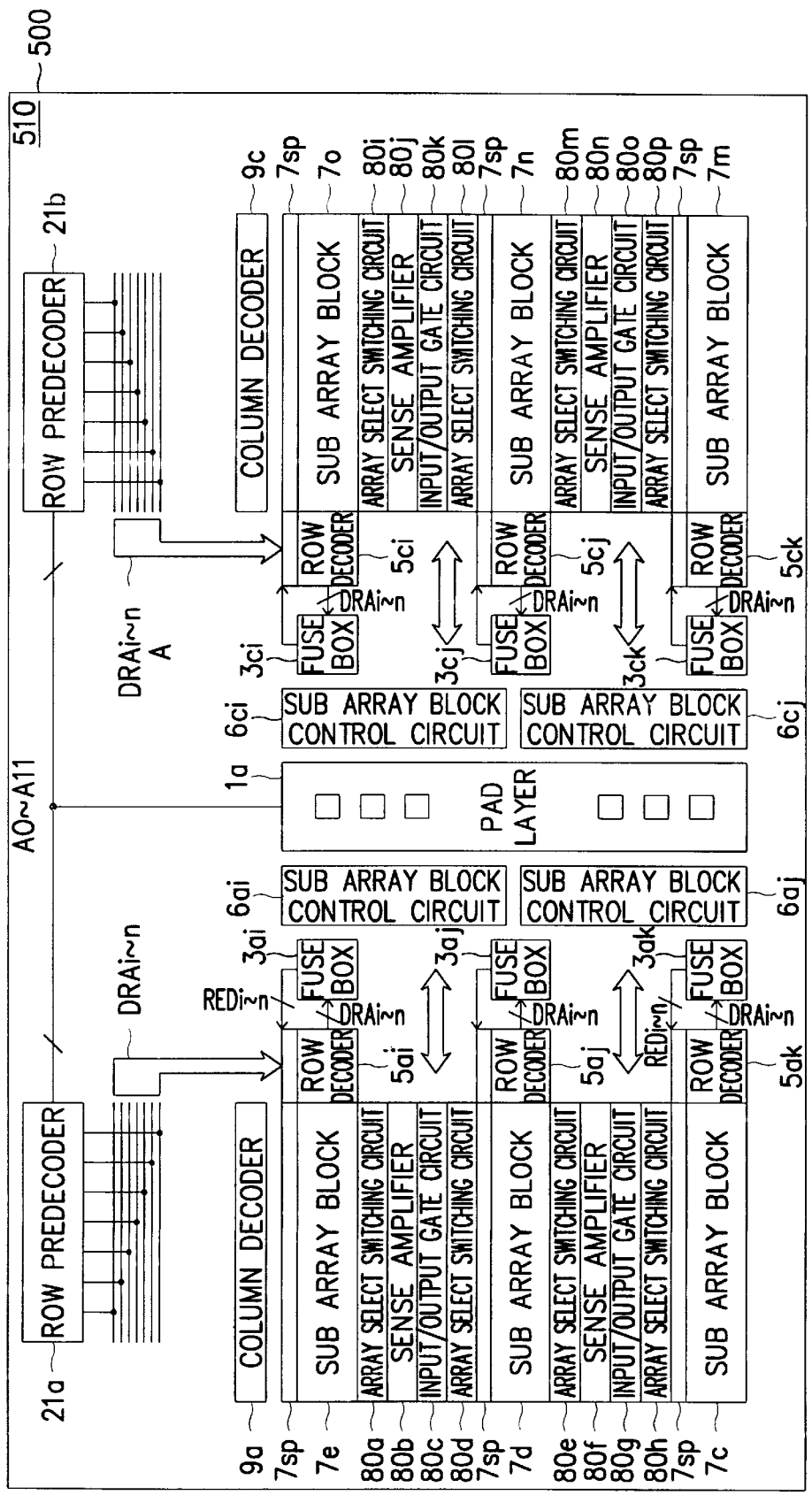
FIG. 4 is a more detailed layout of fuse boxes within row redundancy circuits shown in FIG. 3.

FIG. 4 is a more detailed layout of fuse boxes within the row redundancy circuits 3a and 3c shown in FIG. 3. As was the case with FIG. 2 when turning the drawing of FIG. 3 counterclockwise by 90°, the layout of the fuse boxes within the row redundancy circuits may be seen. The subarray block control circuits 6ai, 6aj, 6ci and 6cj, and the row decoders 5ai, 5aj, 5ak, 5ci, 5cj and 5ck are arranged as was shown in FIG. 2. However, the six fuse boxes 3ai, 3aj, 3ak, 3ci, 3cj and 3ck, connected between the row decoders and the subarray block control circuits, are arranged differently from those shown in FIG. 2. As noted above, since the layout of FIG. 4 is symmetrical to the right and left, the layout to the left of the pad layer 1a will be described hereinafter.

The predecoding row addresses DRAi-DRAn generated through the output buses of the row predecoder 21a are commonly applied to the row decoders 5ai, 5aj and 5ak and to the fuse boxes 3ai, 3aj and 3ak. In FIG. 4, the general locations of the redundancy enable bus that transfers the redundancy enable signals REDi-REDn and the predecoded row address bus that transfers the predecoding row addresses DRAi-DRAn are also shown. Since the redundancy enable bus for transferring the redundancy enable signals REDi-REDn correspond to each row decoder, the size of the integrated circuit need not increase, and the bus line loading can be reduced, thus allowing reduced power consumption.

Figure 6:
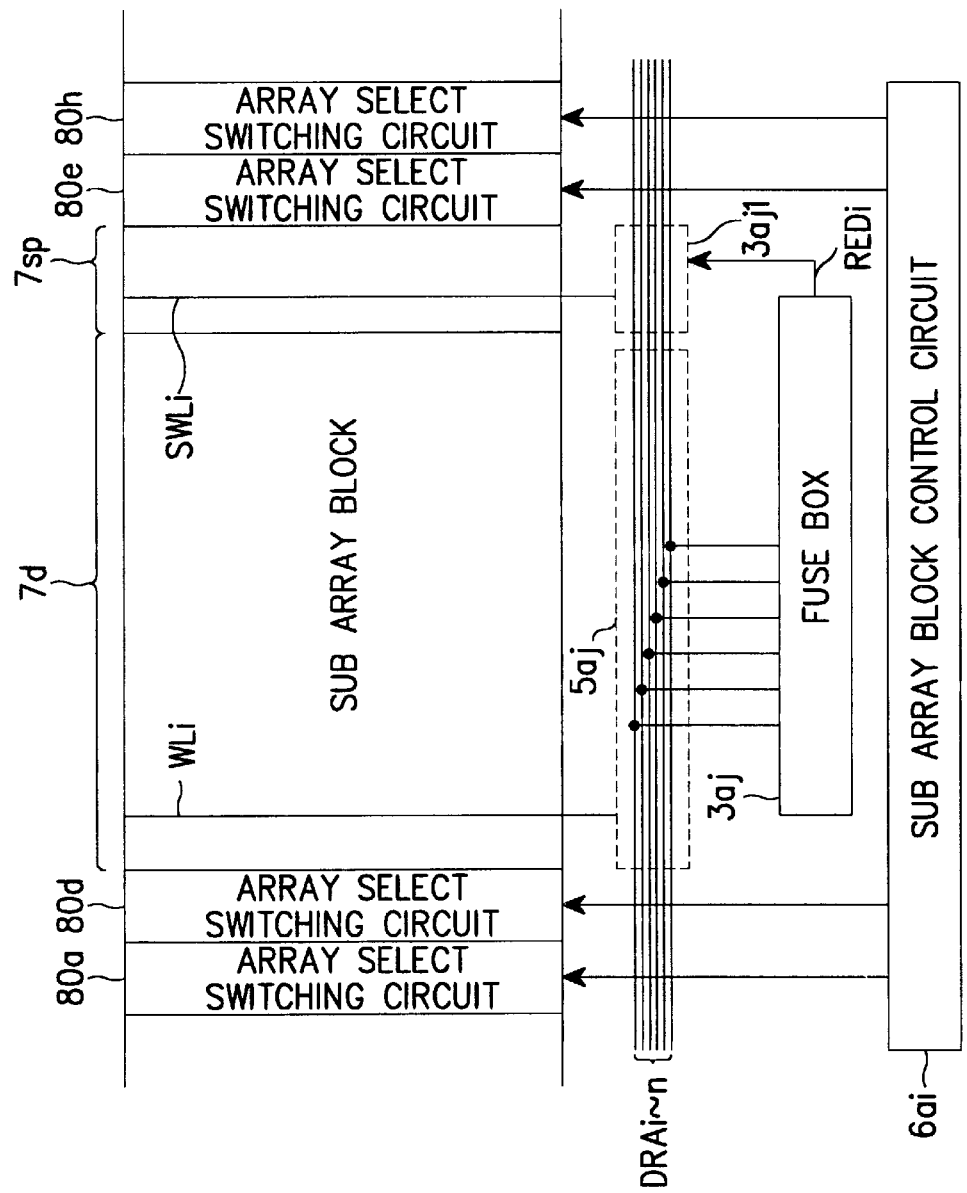
FIG. 6 is a detailed layout of a fuse box shown in FIG. 4.

A detailed layout of a fuse box is illustrated in FIG. 6. The fuse box 3aj is connected between the row decoder 5aj and the subarray block control circuit 6ai. The row decoder 5aj overlaps the predecoded row address bus layer for transferring the predecoding row addresses DRAi-DRAn. Preferably, the row decoder 5aj is beneath the predecoded row address bus layer for transferring the predecoding row addresses DRAi-DRAn.

If there are no defects in the memory cells connected to any word line WLi within the subarray block 7d, the row decoder 5aj receives and decodes the applied predecoding row addresses and supplies a select signal for designating the word line WLi to a normal word line driver. However, if one of the memory cells connected to the word line WLi is defective, the word line WLi may be replaced with a spare word line SWLi. In this case, since the fuse box 3aj has been cut, the redundancy enable signal REDi is activated. The activated redundancy enable signal is supplied to a redundancy word line driver 3aj1 which may include NMOS transistors. When the spare word line SWLi is activated, the normal word line WLi is deactivated. As shown in FIG. 6, the fuse box 3aj receives the predecoding addresses DRAi-DRAn through the buses connected at a right angle to the buses arranged at the upper portion of the row decoder 5aj. To further reduce the size of the integrated circuit, the layer of the orthogonally connected buses may be positioned above the row decoder 5aj. As also shown, the redundancy enable bus REDi extends from the fuse box 3aj, up to but not beyond the predecoded row address bus DRAi-DRAn.

Figure 5:
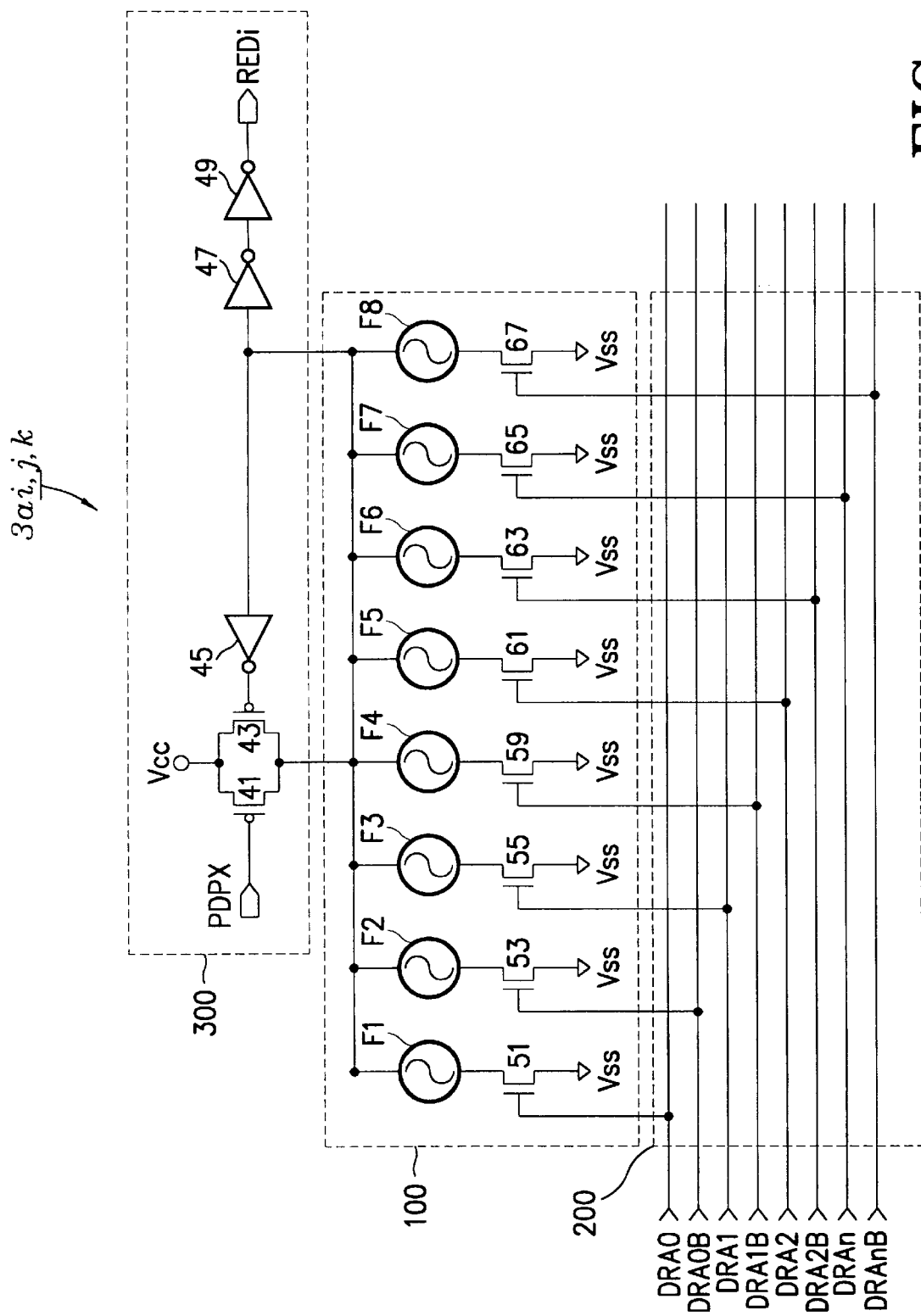
FIG. 5 is a detailed circuit diagram of one fuse box shown in FIG. 4.

FIG. 5 illustrates a detailed circuit diagram of one fuse box shown in FIG. 4. The fuse box includes a fuse circuit 100, an input circuit 200 and a precharge and output circuit 300. The fuse circuit 100 includes fuses F1–F8, and NMOS transistors 51, 53, . . . , 67 connected to the fuses F1–F8. The precharge and output circuit 300 includes a PMOS transistor 41 with a gate connected to receive a precharge signal PDPX, a PMOS transistor 43 with a source connected to receive a power source Vcc, an inverter 45 with an output terminal connected to a gate of the transistor 43, an input terminal connected to an output terminal of the fuse circuit 100, and driving inverters 47 and 49 serially connected to the output terminal of the fuse circuit 100. The input circuit 200 is preferably connected at a right angle to the buses arranged at the row decoder 5aj to receive the predecoding row addresses DRAi-DRAn, and preferably includes buses that are arranged on a different layer.

Since the output of the fuse box may be directly applied to the adjacent row decoder by arranging the fuse box between the row decoder and the subarray block control circuit, the bus line loading can be reduced. Thus, the size of the integrated circuit may be reduced by rearranging the layout of the peripheral circuit. The power consumption can also be reduced by reducing the bus line loading.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   an array of memory cells that are arranged in a plurality of subarray blocks having rows and columns;
   a row decoder that designates at least one row of the subarray blocks; a subarray block control circuit that controls the plurality of subarray blocks to write data into the memory cells and to read data from the memory cells; and
   a row redundancy fuse box that replaces a defective row with a redundant row, the row redundancy fuse box being located between the row decoder and the subarray block control circuit in the integrated circuit memory device.

2. An integrated circuit memory device according to claim 1 further comprising a row predecoder that is coupled to the row redundancy fuse box, the row predecoder being located remote from the row decoder, the subarray block control circuit and the row redundancy fuse box in the integrated circuit memory device.

3. An integrated circuit memory device according to claim 2 further comprising a column decoder that is located adjacent the row predecoder and remote from the row decoder, the subarray block control circuit and the row redundancy fuse box in the integrated circuit memory device.

4. An integrated circuit memory device according to claim 1 further comprising a pad layer that receives and transmits external input and output signals respectively, the pad layer being located adjacent the subarray block control circuit, opposite the row redundancy fuse box in the integrated circuit memory device.

5. An integrated circuit memory device according to claim 2 further comprising a predecoded row address bus that couples the row predecoder to the row redundancy fuse box, wherein the row decoder and the predecoded row address bus overlap one another in the integrated circuit memory device.

6. An integrated circuit memory device according to claim 5 further comprising a redundancy enable bus that couples the row redundancy fuse box to the row decoder, wherein the redundancy enable bus extends from the fuse box, up to but not beyond the predecoded row address bus.

7. An integrated circuit memory device comprising:
   an array of memory cells that are arranged in a plurality of subarray blocks having rows and columns;
   a row decoder that designates at least one row of the subarray blocks; a pad layer that receives and transmits external input and output signals respectively; and
   a row redundancy fuse box that replaces a defective row with a redundant row, the row redundancy fuse box being located between the row decoder and the pad layer in the integrated circuit memory device.

8. An integrated circuit memory device according to claim 7 further comprising a row predecoder that is coupled to the row redundancy fuse box, the row predecoder being located remote from the row decoder, the pad layer and the row redundancy fuse box in the integrated circuit memory device.

9. An integrated circuit memory device according to claim 8 further comprising a column decoder that is located adjacent the row predecoder and remote from the row decoder, the pad layer and the row redundancy fuse box in the integrated circuit memory device.

10. An integrated circuit memory device according to claim 7 further comprising a subarray block control circuit that controls the plurality of subarray blocks to write data into the memory cells and to read data from the memory cells, the subarray block control circuit being located between the row redundancy fuse box and the pad layer in the integrated circuit memory device.

11. An integrated circuit memory device according to claim 8 further comprising a predecoded row address bus that couples the row predecoder to the row redundancy fuse box, wherein the row decoder and the predecoded row address bus overlap one another in the integrated circuit memory device.

12. An integrated circuit memory device according to claim 11 further comprising a redundancy enable bus that couples the row redundancy fuse box to the row decoder, wherein the redundancy enable bus extends from the fuse box, up to but not beyond the predecoded row address bus.

13. An integrated circuit memory device comprising:
    an array of memory cells that are arranged into a plurality of subarray blocks having rows and columns;
    a row decoder that designates at least one row of the subarray blocks; a row predecoder;
    a row redundancy fuse box that replaces a defective row with a redundant row;
    a predecoded row address bus that couples the row predecoder to the row decoder; and
    a redundancy enable bus that couples the row redundancy fuse box to the row decoder, wherein the redundancy enable bus extends from the fuse box, up to but not beyond the predecoded row address bus.

14. An integrated circuit memory device according to claim 13 further comprising:
    a subarray block control circuit that controls the plurality of subarray blocks to write data into the memory cells and to read data from the memory cells;
    wherein the row redundancy fuse box is located between the row decoder and the subarray block control circuit in the integrated circuit memory device.

15. An integrated circuit memory device according to claim 14 wherein the row predecoder is located remote from the row decoder, the subarray block control circuit and the row redundancy fuse box in the integrated circuit memory device.

16. An integrated circuit memory device according to claim 14 further comprising a column decoder that is located adjacent the row predecoder and remote from the row decoder, the subarray block control circuit and the row redundancy fuse box in the integrated circuit memory device.

17. An integrated circuit memory device according to claim 14 further comprising a pad layer that receives and transmits external input and output signals respectively, the pad layer being located adjacent the subarray block control circuit and opposite the row redundancy fuse box in the integrated circuit memory device.

18. An integrated circuit memory device according to claim 13 wherein the row decoder and the predecoded row address bus overlap one another in the integrated circuit memory device.

19. An integrated circuit memory device comprising:
    an array of memory cells that are arranged in a plurality of subarray blocks having rows and columns;
    a row decoder that designates at least one row of the subarray blocks;
    a row predecoder;
    a row redundancy fuse box that replaces a defective row with a redundant row;

a predecoded row address bus that couples the row redundancy fuse box to the row decoder; and a redundancy enable bus that couples the row redundancy fuse box to the row decoder, wherein the predecoded row address bus and the row decoder overlap one another in the integrated circuit memory device.

20. An integrated circuit memory device according to claim 19 wherein the row decoder is beneath the predecoded row address bus in the integrated circuit memory device.

21. An integrated circuit memory device according to claim 19 wherein the redundancy enable bus extends from the fuse box, up to but not beyond the predecoded row address bus.

* * * * *